(12) United States Patent
Ito (10) Patent No.: US 9,383,963 B2
(45) Date of Patent: Jul. 5, 2016

(54) QUANTITY ADJUSTING APPARATUS

(71) Applicant: Onkyo Corporation, Osaka (JP)

(72) Inventor: Kazunari Ito, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 20 days.

(21) Appl. No.: 14/488,729

(22) Filed: Sep. 17, 2014

(65) Prior Publication Data

US 2015/0086042 A1 Mar. 26, 2015

(30) Foreign Application Priority Data

Sep. 24, 2013 (JP) ................................. 2013-197139

(51) Int. Cl.
| | |
|---|---|
| *H03G 3/00* | (2006.01) |
| *G06F 3/16* | (2006.01) |
| *H03G 3/02* | (2006.01) |
| *H03G 3/04* | (2006.01) |
| *H01H 19/00* | (2006.01) |

(52) U.S. Cl.
CPC ................ *G06F 3/165* (2013.01); *H03G 3/001* (2013.01); *H03G 3/02* (2013.01); *H03G 3/04* (2013.01); *H01H 2019/006* (2013.01)

(58) Field of Classification Search
CPC ........... H03G 3/001; H03G 3/02; H03G 3/04; H01H 19/005; H01H 2019/006
USPC ....................................................... 381/109
See application file for complete search history.

(56) References Cited

U.S. PATENT DOCUMENTS

| | | | |
|---|---|---|---|
| 5,317,558 A | 5/1994 | Yagami et al. | |
| 5,856,792 A | 1/1999 | Stevens | |
| 5,877,710 A | 3/1999 | Kagerbauer | |
| 2009/0208035 A1 | 8/2009 | Sunaga et al. | |

FOREIGN PATENT DOCUMENTS

| | | |
|---|---|---|
| JP | H03-119391 | 5/1991 |
| JP | H06-013216 | 2/1994 |
| JP | 2001-028525 | 7/1999 |
| JP | 3654064 | 6/2005 |
| JP | 2008-048318 | 2/2008 |
| JP | 2011-230569 | 11/2011 |

OTHER PUBLICATIONS

Chinese Office Action for corresponding Chinese Application No. JP 2013-197139 mailed Dec. 16, 2014.
Chinese Decision to Grant for corresponding Chinese Application No. JP 2013-197139 mailed Feb. 17, 2015.

*Primary Examiner* — Duc Nguyen
*Assistant Examiner* — Kile Blair
(74) *Attorney, Agent, or Firm* — Renner, Otto, Boisselle & Sklar, LLP (57) ABSTRACT

To realize a change in a volume that does not give a user a feeling of strangeness even when a great processing load is put on a volume determining unit. A volume controller performs a process for determining a new volume of an audio signal based on an alternate pulse interval that is based on a counting time and the number of pulses counted by a counting section within the counting time and a current volume stored in a storage section, and storing the determined new volume as the current volume in the storage section, the same number of times as the number of pulses counted by the counting section every counting time, and outputs last information stored as the current volume in the storage section to an electronic volume.

4 Claims, 7 Drawing Sheets

QUANTITY ADJUSTING APPARATUS

BACKGROUND OF THE INVENTION

1. Field of the Invention

The present invention relates to a quantity adjusting apparatus that adjusts a volume of an audio signal and quantities such as the number of minutes and the number of seconds of time.

2. Description of the Related Art

There is a quantity adjusting apparatus that adjusts quantities such as a volume of an audio signal and the number of minutes and the number of seconds of time by an operation performed by a user through an operating section. A volume adjusting apparatus that adjusts a volume of an audio signal is provided to various apparatuses that generate audio such as AV equipment including a stereo unit and a television set, and a personal computer. A conventional volume adjusting apparatus includes a volume knob for instructing a volume of an audio signal, a rotary encoder for outputting a pulse according to an operating speed of the volume knob, a microcomputer for determining a volume of an audio signal, and an electronic volume for changing a volume of an audio signal based on the volume of the audio signal determined by the microcomputer. The rotary encoder is rotatable together with the volume knob, and outputs a pulse every time it rotates a predetermined angle so as to output a pulse according to an operating speed (rotational angular velocity) of the volume knob. The microcomputer determines a new volume every time a pulse is output from the rotary encoder. For example, the microcomputer determines, as a new volume, a volume obtained by adding 2 dB to a current volume every time a pulse is output. Then, the electronic volume changes a volume of an audio signal into a new volume determined by the microcomputer. Whether the volume is increased or decreased, that is, in which direction the volume knob is turned can be determined by comparing two kinds of pulses having different phases which are output from the rotary encoder.

In the conventional volume adjusting apparatus, the number of pulses has a directly proportional relationship with the increase/decrease of the volume. For this reason, for example, when a volume is set to be increased/decreased by 1 dB with respect to one pulse, that is, when a change in the volume with respect to one pulse is set small, a user needs to greatly turn the volume knob in order to greatly change the volume. On the contrary, for example, when the volume is set to be increased/decreased by 4 dB with respect to one pulse, that is, when the change in the volume with respect to one pulse is set large, it is difficult for the user to finely adjust the volume. The conventional volume adjusting apparatus is not easy for the user to handle.

A volume adjusting apparatus described in Japanese Patent No. 3654064 determines a new volume, every time a pulse is output (a pulse period is measured), based on a pulse interval (period) that is an interval between output start times of two pulses and a current volume. Specifically, a new volume is determined according to a function represented by the following equation (1). Herein, V represents a current volume, $T_p$ represents a pulse interval, a, b, c, and d represent constants larger than 0.

$$|f(V,T_p)|=a/(T_p+b)(V+c)+d \tag{1}$$

When the volume is determined according to the equation (1), an absolute value $|f(V,Tp)|$ of the volume is inversely proportional to a pulse interval $T_p$. For this reason, when the volume knob is turned slowly, the pulse interval $T_p$ output from the rotary encoder becomes large, and thus a variation of the absolute value $|f(V,T_p)|$ of the volume becomes small. Further, since the time interval at which the volume is changed becomes longer, the user can easily and finely adjust the volume by turning the volume knob slowly. On the contrary, when the volume knob is turned fast, the pulse interval $T_p$ output from the rotary encoder becomes small, and thus the variation of the absolute value $|f(V,T_p)|$ of the volume becomes large. Further, since the time interval at which the volume is changed is shortened, the user can easily and greatly change the volume by turning the volume knob fast. Thus, the volume adjusting apparatus described in Japanese Patent No. 3654064 is easier for the user to handle than the above conventional volume adjusting apparatus.

As described above, the volume adjusting apparatus described in Japanese Patent No. 3654064 determines a new volume based on a pulse interval and a current volume every time a pulse is output. However, when a process of determining a new volume is performed every time a pulse is output, this process for determining a new volume disturbs processes other than the process for adjusting the volume by the microcomputer (for example, operation control of AV equipment having the volume adjusting apparatus). Therefore, in order to reduce the load of the microcomputer, it is considered to count the number of pulses within predetermined time, measure the pulse interval, and perform the calculation based on the equation (1) the same number of times as the counted number of pulses after lapse of the predetermined time, so as to determine a new volume. However, in this case, when the number of pulses counted within the predetermined time is two or more, the time interval between output starting times of two pulses cannot be properly measured, and a false volume might be determined according to the equation (1). In some cases, the time intervals of every volume determining process performed by the microcomputer are varied according to the load on the microcomputer. For example, when the load on the microcomputer is small, the time interval of the volume determining process is shortened, whereas when the load on the microcomputer is large, the time interval of the volume determining process is lengthened. Particularly, when the load on the microcomputer is large and the time interval of the volume determining process performed by the microcomputer is lengthened, the number of pulses counted within the predetermined time becomes large. For this reason, it is highly unlikely that the time interval of the output starting times of two pulses is properly measured, and a false volume is more likely to be determined. When the false volume is determined and a volume of an audio signal is changed by the electronic volume, the change in the volume gives the user a feeling of strangeness.

SUMMARY OF THE INVENTION

It is an object of the present invention to realize a change in a quantity that does not give a user a feeling of strangeness even when a great processing load is put on a quantity determining unit.

A quantity adjusting apparatus comprising: an operating section for instructing a quantity of a subject to be adjusted; a pulse output section for outputting a pulse according to an operating speed of the operating section; a storage section for storing a current quantity of the subject to be adjusted; a counting section for counting a number of the pulses output from the pulse output section within a counting time; a quantity controller for performing a process for determining a new quantity of the subjects to be adjusted based on a pulse interval that is an interval of an output start time of the two pulses and the current quantity stored in the storage section and storing the determined new quantity as the current quantity in the storage section, the same number of times as the number of the pulses counted by the counting section every counting time and for outputting last information stored as the current quantity in the storage section; and a quantity changing section for changing the quantity of the subject to be adjusted based on information about the current quantity output from the quantity controller, wherein the quantity controller uses an alternate pulse interval that is based on the counting time and the number of pulses counted by the counting section within the counting time as the pulse interval.

In the present invention, an alternate pulse interval based on a counting time and the number of pulses counted by a counting section within the number of the counting time is used as a pulse interval for determining a quantity of a subject to be adjusted. Therefore, even when a great processing load is put on a quantity controller for determining a quantity, the time interval (counting time) in each quantity determining process becomes longer, and the number of pulses counted within the counting time becomes large, determination of false quantity due to a measuring error of the pulse interval can be prevented because the quantity of the subject to be adjusted is determined without using the measured pulse interval. As a result, even when a great processing load is put on the quantity controller, a change in the quantity that does not give a user a feeling of strangeness can be realized.

Preferably, the quantity controller divides the counting time by the number of pulses counted by the counting section, to calculate the alternate pulse interval.

In the present invention, the counting time is divided by the counted number of pulses, so that the alternate pulse interval is calculated. Therefore, the alternate pulse interval can be easily calculated. Further, since the quantity is determined based on an averaged pulse interval, when the quantity is determined a plurality of times in the quantity determining process performed every time the counting time elapses, increase/decrease in the quantity to be determined is averaged, and thus the change in the quantity does not give the user a feeling of strangeness.

Preferably, when a value obtained by dividing the counting time by the number of pulses counted by the counting section is a value after a decimal point, the quantity controller adjusts the divided value to an integer and calculates the alternate pulse interval.

In the present invention, when a value obtained by dividing the counting time by the number of pulses counted by the counting section is a value after the decimal point, the quantity controller adjusts the divided value to an integer, so that the alternate pulse interval is calculated. Therefore, for example, even when a microcomputer that functions as the quantity controller cannot perform a calculation of decimal places, the alternate pulse interval can be calculated.

Preferably, the subject to be adjusted is an audio signal, and the quantity is a volume.

In the present invention, the quantity controller determines a new volume of an audio signal based on the alternate pulse interval and a current volume. The quantity changing section changes the volume of the audio signal based on information about the volume determined by the quantity controller. As a result, even when a great processing load is put on the quantity controller, the change in the volume that does not give the user a feeling of strangeness can be realized.

DETAILED DESCRIPTION OF THE PREFERRED EMBODIMENT

Figure 1:
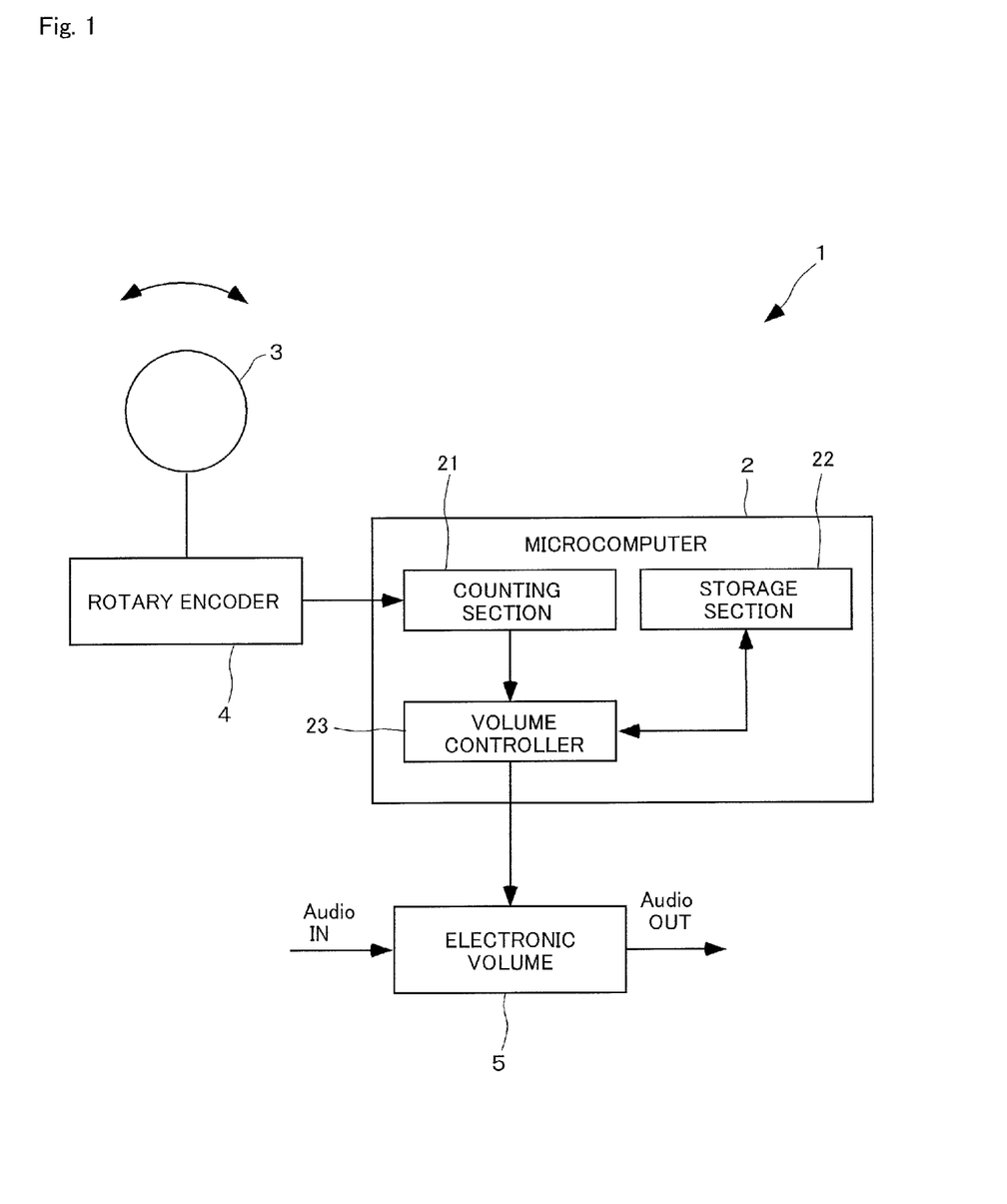
FIG. 1 is a block diagram illustrating a configuration of a volume adjusting apparatus according to an embodiment of the present invention.

An embodiment of the present invention is described below. FIG. 1 is a block diagram illustrating a configuration of a volume adjusting apparatus according to this embodiment. A volume adjusting apparatus 1 (quantity adjusting apparatus) changes a volume (quantity) of an audio signal (subject to be adjusted) to be input and outputs the audio signal. As shown in FIG. 1, the volume adjusting apparatus 1 includes a microcomputer 2, a volume knob 3, a rotary encoder 4, and an electronic volume 5.

The microcomputer 2 is configured by hardware such as a CPU (Central Processing Unit), a ROM (Read Only Memory), a RAM (Random Access Memory), and an input/output interface. The CPU makes a control so that the hardware constituting the microcomputer 2 functions as respective function sections such as a counting section 21 according to a program stored in the ROM. The respective function sections such as the counting section 21 may be constituted by an electronic circuit specialized for an arithmetic process in the respective function sections, or another configuration may be used. Details of the microcomputer 2 are described later.

The volume knob 3 (operating section) is for instructing a volume of an audio signal. The volume knob 3 is rotatable in normal and reverse directions, i.e., a clockwise direction (normal direction) and a counterclockwise direction (reverse direction). For example, a user turns the volume knob 3 to the clockwise direction so as to instruct the volume adjusting apparatus 1 to increase the volume. Further, for example, the user turns the volume knob 3 to the counterclockwise direction so as to instruct the volume adjusting apparatus 1 to decrease the volume.

The rotary encoder 4 (pulse output section) outputs a pulse according to an operating speed of the volume knob 3. Specifically, the rotary encoder 4 rotates in the normal and reverse directions, i.e., the clockwise and counterclockwise directions together with the volume knob 3, and outputs two kinds of pulses having frequencies in accordance with a rotational angular velocity (operating speed). Phases of the two kinds of pulses output from the rotary encoder 4 are different by 90°, for example, to each other. Further, the rotary encoder 4 outputs, for example, 24 pulses of two kinds every time of rotation.

Figure 2:
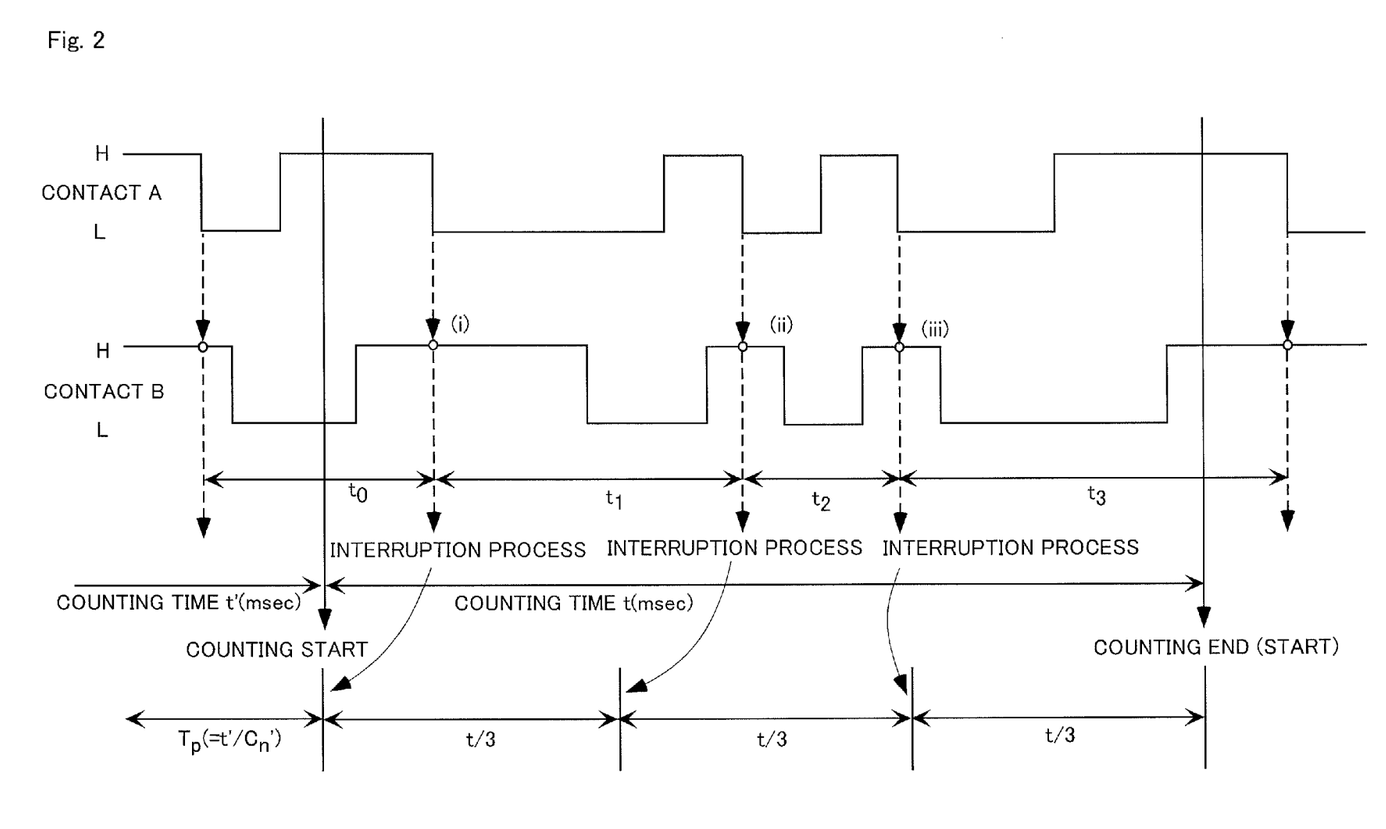
FIG. 2 is a diagram illustrating one example of a pulse to be output from a rotary encoder.

Herein, a relationship between the two kinds of pulses output from the rotary encoder 4 and the rotating direction of the rotary encoder 4 is described. FIG. 2 is a diagram illustrating one example of the pulse output from the rotary encoder 4. A horizontal direction represents time, and a vertical direction represents a voltage level. The rotary encoder 4 has two pulse output contacts (contacts A and B), and outputs two kinds of pulses having phases different from each other.

In this embodiment, when the voltage level falls at the contact A and the voltage level at the contact B is "H (High)", the rotary encoder 4 is rotated in the clockwise direction ((i), (ii), and (iii) in FIG. 2). Further, in this embodiment, when the voltage level rises at the contact A and the voltage level of the contact B is "L (Low)", the rotary encoder 4 is rotated in the counterclockwise direction.

The electronic volume 5 (quantity changing section) changes a volume of an audio signal based on information about a current volume output from a volume controller 23, described later. Specifically, the electronic volume 5 varies an attenuation factor of an analog audio signal according to volume setting data composed of, for example, 8-bit digital data serially supplied from the microcomputer 2. The volume change range is, for example, 0 to 80 dB.

The microcomputer 2 is described below. The microcomputer 2 functions as the counting section 21, a storage section 22, and the volume controller 23. The storage section 22 stores a current volume of an audio signal. The current volume stored in the storage section 22 is rewritten by the volume controller 23, described later.

Figure 3:
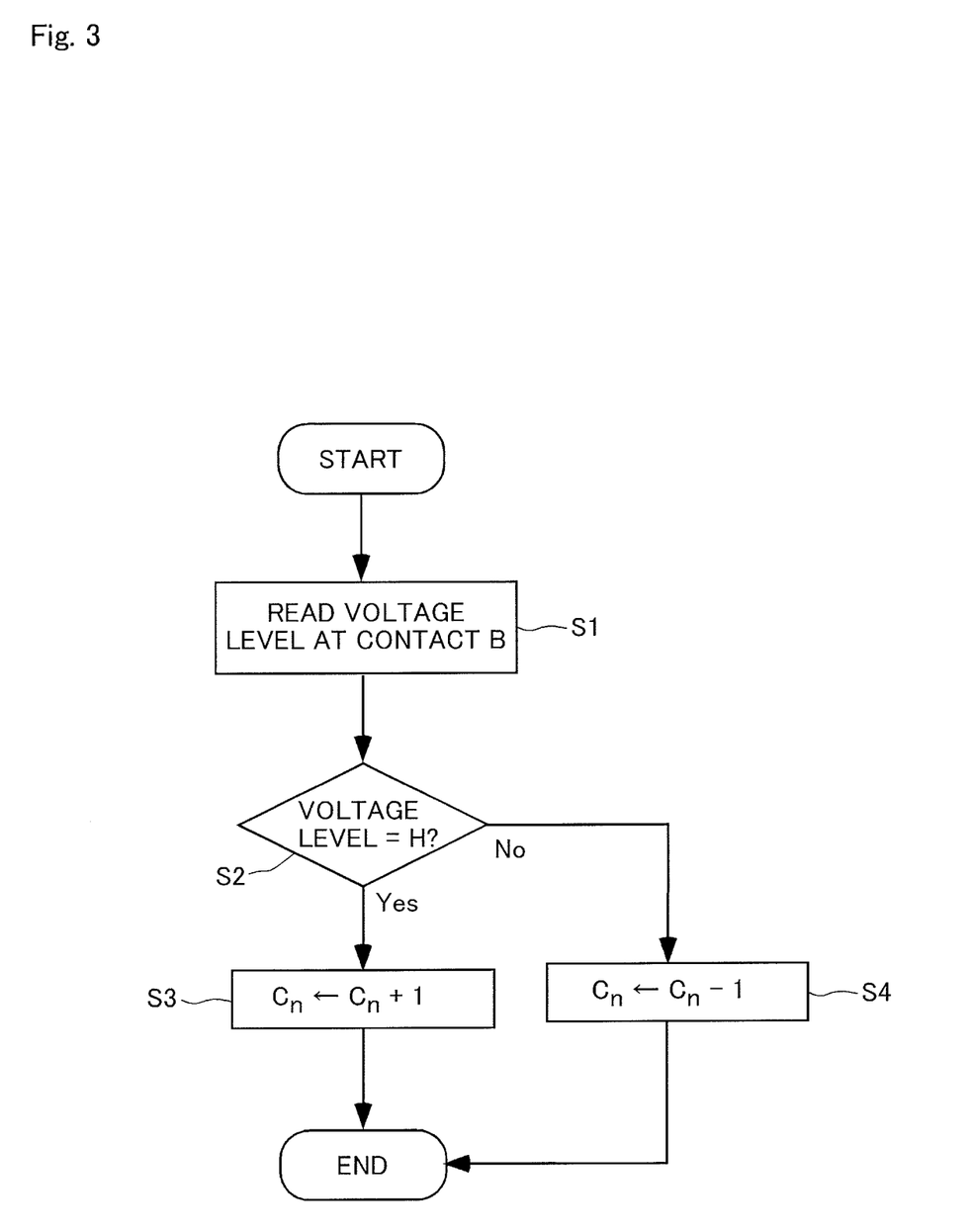
FIG. 3 is a flowchart illustrating a processing operation of the volume adjusting apparatus when an interruption process is generated.

The counting section 21 counts the number of pulses output from the rotary encoder 4 within the counting time. In this embodiment, when the voltage level at the contact A of the rotary encoder 4 falls and rises, the interruption process is generated, and when the interruption process is generated, the counting section 21 counts the number of pulses. FIG. 3 is a flowchart illustrating a processing operation of the volume adjusting apparatus 1 when the interruption process is generated. When the interruption process is generated, the counting section 21 reads the voltage level at the contact B of the rotary encoder 4 (S1). Then, the counting section 21 determines whether the voltage level at the contact B is "H" (S2). When the counting section 21 determines that the voltage level at the contact B is "H", that is, the rotary encoder 4 is rotated in the clockwise direction (normal direction) (S2: Yes), the counting section 21 increases a counter variable C of the number of pulses by 1 (S3). On the other hand, when the counting section 21 determines that the voltage level at the contact B is not "H" (the voltage level is "L"), that is, the rotary encoder 4 is rotated in the counterclockwise direction (reverse direction) (S2: No), the counting section 21 decreases the counter variable C of the number of pulses by 1 (S4). The counting section 21 repeatedly performs the processing operation shown in FIG. 3 from start of the counting time of the number of pulses to end of the counting time of the number of pulses each time the interruption process is generated, and counts the number of pulses output from the rotary encoder 4 within the counting time. In the example shown in FIG. 2, since the voltage level at the contact B is "H" in the first interruption process (i) within a counting time t, the counting section 21 increases the counter variable C of the number of pulses from an initial value 0 to 1. Since the voltage level at the contact B is "H" in the second interruption process (ii) within the counting time t, the counting section 21 increases the counter variable C of the number of pulses from the current value 1 to 2. Since the voltage level at the contact B is "H" in the third interruption process (iii) within the counting time t, the counting section 21 increases the counter variable C of the number of pulses from the current value 2 to 3. Therefore, in the example shown in FIG. 2, the counting section 21 counts the number of pulses 3 (C=3) within the counting time t. When the rotary encoder 4 is rotated in the clockwise direction (normal direction), a value lager than 0 is counted as the number of pulses. On the contrary, when the rotary encoder 4 is rotated in the counterclockwise direction (reverse direction), a value smaller than 0 is counted as the number of pulses. Herein, the counting time is varied by the microcomputer 2 according to the load on the microcomputer 2.

The volume controller 23 determines a volume of the audio signal and outputs the determined volume to the electronic volume 5. Specifically, the volume controller 23 determines a new volume of the audio signal based on a pulse interval that is a starting time interval between the outputs of two pulses and a current volume stored in the storage section 22. The volume controller 23 determines a new volume of the audio signal according to the following equation (1). Herein, |f(V, $T_p$)| represents an absolute value of a variation of the volume, V represents the current volume stored in the storage section 22, $T_p$ represents the pulse interval, and a, b, c, and d represent constants larger than 0.

$$|f(V,T_p)|=a/(T_p+b)(V+c)+d \quad (1)$$

In this embodiment, the constant a=1600, b=6, c=13, and d=1, and the volume controller 23 determines a new volume of the audio signal using the following equation (2).

$$|f(V,T_p)|=1600/(T_p+6)(V+13)+1 \quad (2)$$

When the constant d is set to 1, even if the user turns the volume knob 3 slowly, the volume changes by 1 dB every pulse. In this manner, there can be avoided a situation in which the volume never changes since the rotational angular velocity of the volume knob 3 operated by the user is too slow.

In this embodiment, the volume controller 23 uses an alternate pulse interval that is based on the counting time t and the number of pulses $C_n$ counted by the counting section 21 within the counting time t as the pulse interval $T_p$ for determining the volume. Specifically, the volume controller 23 divides the counting time t by the number of pulses $C_n$ counted by the counting section 21, and calculates the alternate pulse interval $T/C_n(=T_p)$ so as to determine the volume using the calculated alternate pulse interval $T/C_n$. For example, as shown in FIG. 2, when the number of pulses counted by the counting section 21 within the counting time t is $C_n$=3, the alternate pulse interval T/3 is used. The volume controller 23 stores the calculated alternate pulse interval $T_p$ in the storage section 22. In this embodiment, when one or more pulses are counted within the counting time t, it is assumed that the counted first pulse is generated at the counting start time. When two or more pulses are counted within the counting time t, it is assumed that the second and subsequent pulses are generated every $t/C_n$. Therefore, the alternate pulse interval $T_p$ between the first pulse generated within the counting time t and the last pulse generated at the counting time t' before the counting time t is a value $t'/C_n'$ that is obtained by dividing the counting time t' before the counting time t by the number of pulses $C_n'$ counted by the counting section 21.

Further, the volume controller 23 performs a process for determining a new volume of the audio signal based on the alternate pulse interval and the current volume and storing the determined new volume as the current volume in the storage section 22 the same number of times as the number of pulses calculated by the counting section 21 every counting time. The volume controller 23 outputs last information stored as the current volume in the storage section 22 to the electronic volume 5. For example, when the number of pulses $C_n$ counted by the counting section 21 is 3, a process for determining the new volume of the audio signal and storing the determined new volume as the current volume in the storage section 22 is performed three times. The volume controller 23 then outputs the third information stored as the current volume in the storage section 22 to the electronic volume 5. In this manner, the load on the microcomputer 2 (the volume controller 23) is reduced further in comparison with the case where the process for determining a new volume is performed every time the interruption process is generated (every time the pulse is output).

Figure 4:
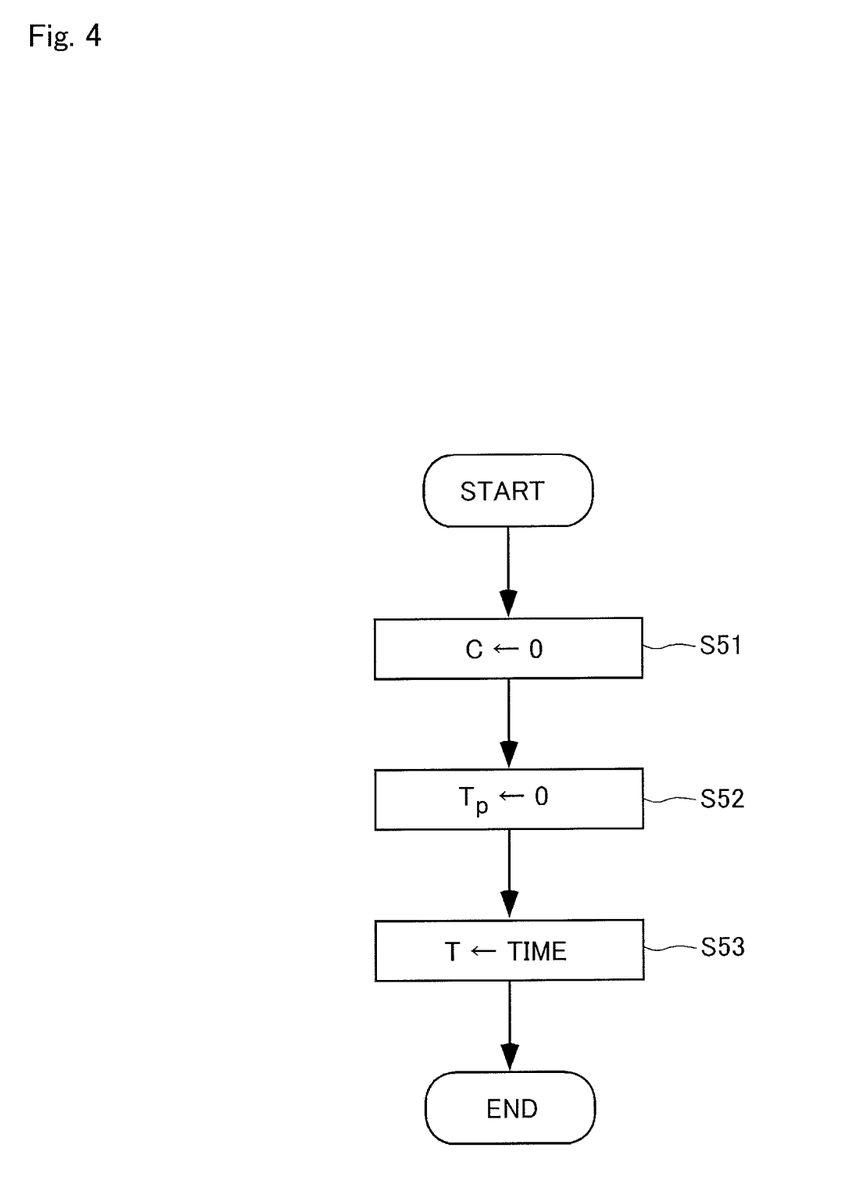
FIG. 4 is a flowchart illustrating an initialization process to be performed by the volume adjusting apparatus before a volume is determined.

An initialization process to be performed by the volume adjusting apparatus 1 before the volume is determined is described based on a flowchart shown in FIG. 4. First, the volume controller 23 initializes the counter variable C of the number of pulses counted by the counting section 21 to 0 (S51). Then, the volume controller 23 initializes the alternate pulse interval $T_p$ to 0 (S52). Then, the volume controller 23 initializes the counting start time T to the current time (S53), and ends the initialization process.

Figure 5:
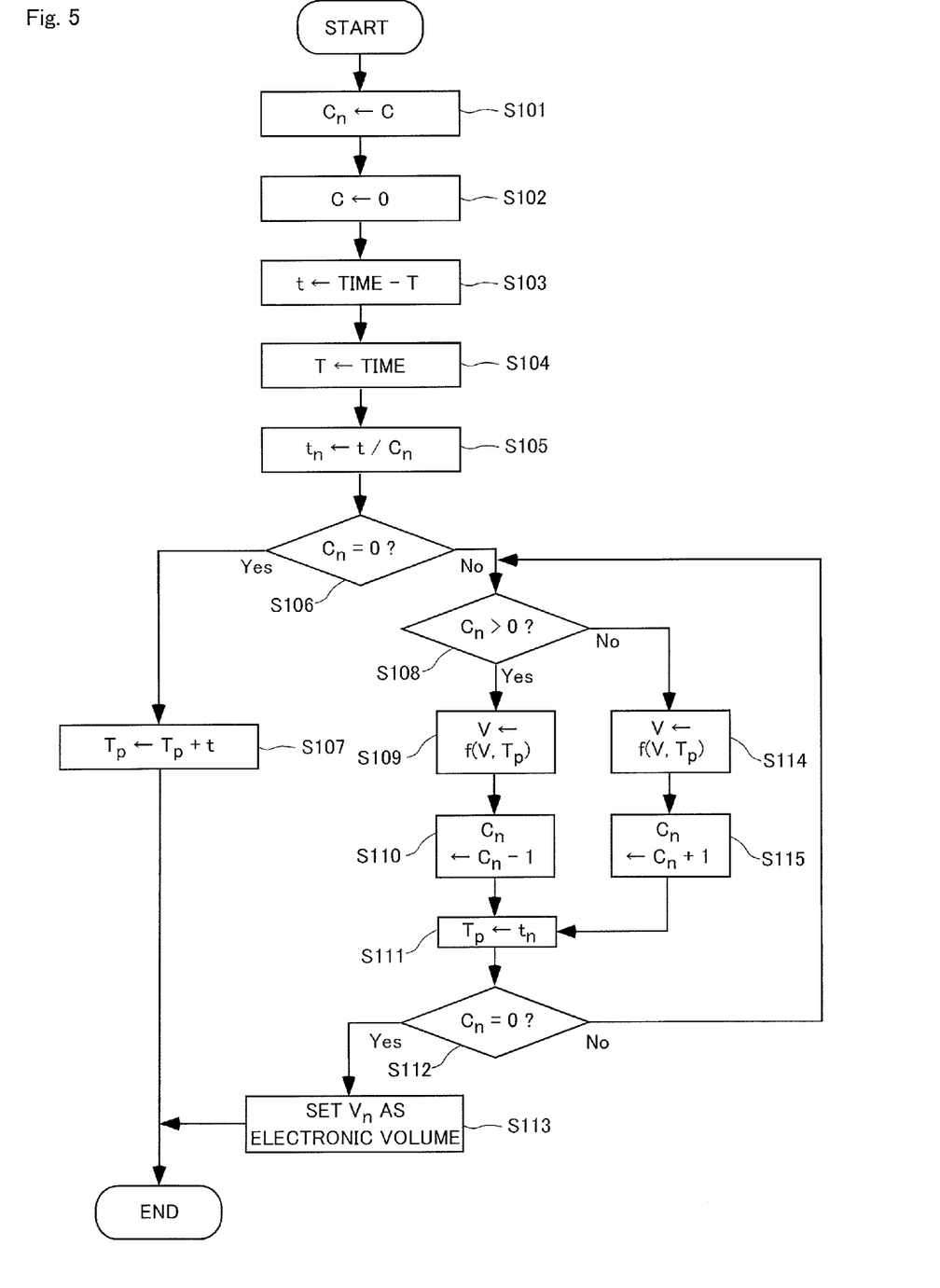
FIG. 5 is a flowchart illustrating a processing operation of the volume adjusting apparatus when a volume is determined.

The processing operation for determining the volume in the volume adjusting apparatus 1 is described based on a flowchart shown in FIG. 5. First, the volume controller 23 replaces the number of pulses $C_n$ by the number of pulses (counter variable) C counted by the counting section 21 (S101). The volume controller 23 initializes the counter variable C to 0 in order to count the number of pulses of the counting section 21 within the next counting time (S102). The volume controller 23 subtracts the counting start time T from the current time so as to calculate the counting time t (S103). The volume controller 23 initializes the counting start time T to the current time in order to count the number of pulses of the counting section 21 within the next counting time (S104). The volume controller 23 divides the counting time t by the number of pulses $C_n$ counted by the counting section 21, so as to calculate $t_n(=t/C_n)$ (S105).

The volume controller 23 determines whether the number of pulses $C_n$ counted by the counting section 21 is 0 (S106). When the volume controller 23 determines that the number of pulses $C_n$ counted by the counting section 21 is 0 (S106: Yes), the volume controller 23 updates the pulse interval $T_p$ stored in the storage section 22 to $T_p+t$ (S107). When the number of pulses $C_n$ is 0, a pulse is not generated within the counting time t, and thus the volume controller adds the counting time t to the pulse interval $T_p$ so as to update the pulse interval $T_p$.

When the volume controller 23 determines that the number of pulses $C_n$ counted by the counting section 21 is not 0 (S106: No), the volume controller 23 determines whether the number of pulses $C_n$ is larger than 0 (S108). When the volume controller 23 determines that the number of pulses $C_n$ is larger than 0 (S108: Yes), the volume controller 23 determines a new volume V of the audio signal based on the pulse interval $T_p$ stored in the storage section 22 and a current volume V according to the equation (2), and stores the determined new volume V in the storage section 22 (S109). In S109, in the case of the process for determining the first volume after lapse of the counting time t, the pulse interval $T_p$ is a pulse interval (=t'/$C_n$') calculated at a counting time t' before the counting time t. Then, the volume controller 23 subtracts 1 from the number of pulses $C_n$, so as to update the number of pulses $C_n$ (S110). This is to perform a process for determining and storing the volume the same number of times as the absolute values of the number of pulses $C_n$. The volume controller 23 rewrites the pulse interval $T_p$ stored in the storage section 22 into $t_n(=t/C_n)$ (S111). Therefore, $t_n$ is used as the pulse interval $T_p$ in the second and subsequent volume determining processes after the lapse of the counting time t and in the first volume determining process after lapse of the next counting time t". Then, the volume controller 23 determines whether the number of pulses $C_n$ is 0 (S112). When the volume controller determines that the number of pulses $C_n$ is not 0 (S112: No), the volume controller 23 performs the process in S108. Hereinafter, when $C_n>0$, the volume controller 23 repeatedly performs the processes in S108 to S112 until the volume controller determines that $C_n=0$ (S112: Yes).

On the other hand, when the volume controller 23 determines that the number of pulses $C_n$ is not larger than 0, that is, the number of pulses $C_n$ is smaller than 0 (S108: No), the volume controller 23 determines a new volume V of the audio signal based on the pulse interval $T_p$ stored in the storage section 22 and the current volume V according to the equation (2), and stores the determined new volume V in the storage section 22 (S114). In S114, in the case of the first volume determining process after the lapse of the counting time t, the pulse interval $T_p$ is the pulse interval (=t'/$C_n$') calculated at the counting time t' before the counting time t. The volume controller 23 adds 1 to the number of pulses $C_n$, so as to update the number of pulses $C_n$ (S115). This is to perform a process for determining and storing the volume the same number of times as the absolute values of the number of pulses $C_n$. The volume controller 23 rewrites the pulse interval $T_p$ stored in the storage section 22 into $t_n(=t/C_n)$ (S111). Therefore, $t_n$ is used in the second and subsequent volume determining processes after the lapse of the counting time t and in the first volume determining process after the lapse of the counting time t". Then, the volume controller 23 determines whether the number of pulses $C_n$ is 0 (S112). When the volume controller 23 determines that the number of pulses $C_n$ is not 0 (S112: No), the volume controller 23 performs the process in S108. Hereinafter, when $C_n<0$, the volume controller 23 repeatedly performs the processes in S108, S114, S115, S111, and S112 until the volume controller 23 determines that $C_n=0$ (S112: Yes).

When the volume controller determines that the number of pulses $C_n$ is 0 (S112: Yes), the volume controller 23 outputs the last information stored as a current volume $V_n$ in the storage section 22 to the electronic volume 5 so as to set $V_n$ as the electronic volume 5 (S113).

As described above, in this embodiment, the alternate pulse interval that is based on the counting time and the number of pulses counted by the counting section 21 within the counting time is used as the pulse interval for determining the volume of the audio signal. Therefore, even when a great processing load is put on the microcomputer 2 that functions as the volume controller 23 for determining a volume, the time interval (counting time) in each volume determining process becomes longer, and the number of pulses counted within the counting time is larger, determination of a false volume due to a counting error of the pulse interval is prevented because the volume of the audio signal is determined without using the measured pulse interval. As a result, even when a great processing load is put on the microcomputer 2, the change in the volume that does not give the user a feeling of strangeness can be realized.

Further, in this embodiment, the counting time is divided by the counted number of pulses, so that the alternate pulse interval is calculated. Therefore, the alternate pulse interval can be easily calculated. Further, since the volume is determined based on an averaged pulse interval, when the volume is determined a plurality of times in the quantity determining process performed every time the counting time elapses, increase/decrease in the volume to be determined is averaged, and the change in the volume does not give the user a feeling of strangeness.

The embodiment of the present invention has been described above, but the applicable mode of the present invention is not limited to the above embodiment and can be suitably modified in a range not departing from the gist of the present invention as illustrated below.

The above embodiment has described the case where the value $t_n=t/C_n$ obtained by dividing the counting time t by the number of pulses $C_n$ counted by the counting section 21 is used as the alternate pulse interval $T_p$. The present invention is not limited thereto, and a value that is obtained by adjusting the value $t_n=t/C_n$ obtained by dividing the counting time t by the number of pulses $C_n$ counted by the counting section 21 may also be used as the alternate pulse interval $T_p$. For example, when the number of pulses $C_n$ is 3, t/2, t/3, and t/6 that are obtained by adjusting $t_n=t/3$ may be used as the pulse interval. Note that, when $t_n=t/C_n$ is adjusted, a difference between the pulse intervals is preferably within a range of t/3 so that the difference between the pulse intervals is not large.

Figure 6:
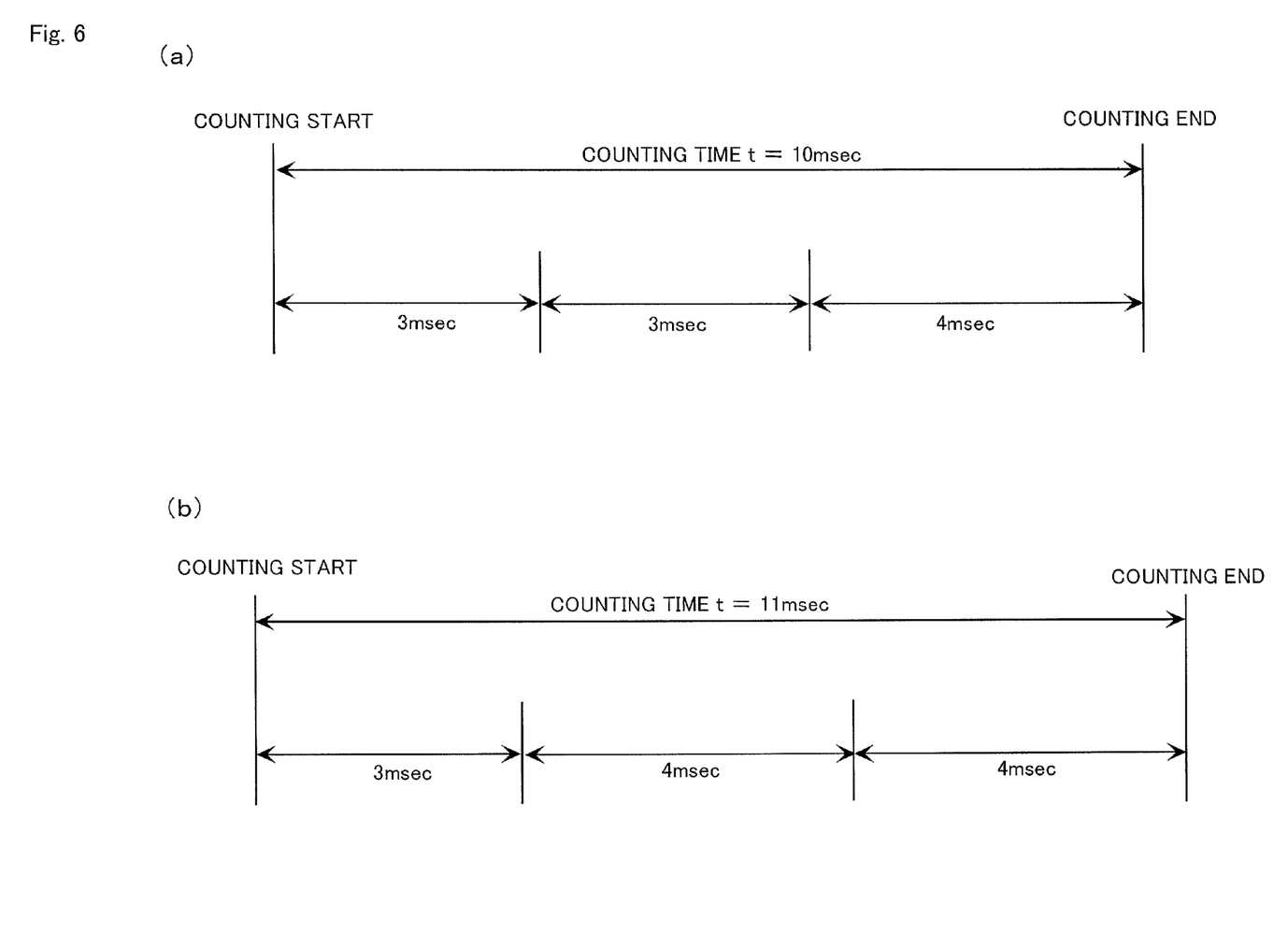
FIG. 6 is a diagram illustrating one modified example of an alternate pulse interval.

Further, for example, when the microcomputer 2 cannot perform a calculation of decimal places, a value obtained by adjusting $t_n=t/C_n$ to an integer may be used as the alternate pulse interval. As shown in FIG. 6(*a*), when the counting time is 10 msec and the counted number of pulses is 3, 10/3=3.3 ..., and thus, for example, 3 msec, 3 msec, and 4 msec are used as the alternate pulse interval. In this case, when $t_n=t/C_n$ is adjusted, it is preferable that an integer of a remainder is equally added to integers of quotient. That is, it is preferable that a difference is not generated in the alternate pulse intervals. For example, as shown in FIG. 6(*b*), when the counting time is 11 msec and the counted number of pulses is 3, the integer of the quotient is 3, and the integer of the remainder is 2. It is preferable that the value of the remainder is equally added to the integers of the quotient for adjustment, and 3 msec, 4 msec, and 4 msec are used as the alternate pulse interval. In this manner, when the value obtained by dividing the counting time by the number of pulses counted by the counting section 21 is a value after the decimal point, the volume controller 23 adjusts the alternate pulse interval to an integer. Thus, even with the microcomputer 2 which cannot perform calculation of decimal places, the alternate pulse interval can be calculated.

For example, when the counting time is 11 msec and the counted number of pulses is 3, an integer of quotient is 3, and an integer of a remainder is 2, but this remainder 2 may be added to the integer of quotient 3 so that the adjustment is made, and 3 msec, 3 msec, and 5 msec can be used as the alternate pulse interval. However, when the difference in the alternate pulse intervals is large, the change in the volume occasionally gives the user a feeling of strangeness.

Figure 7:
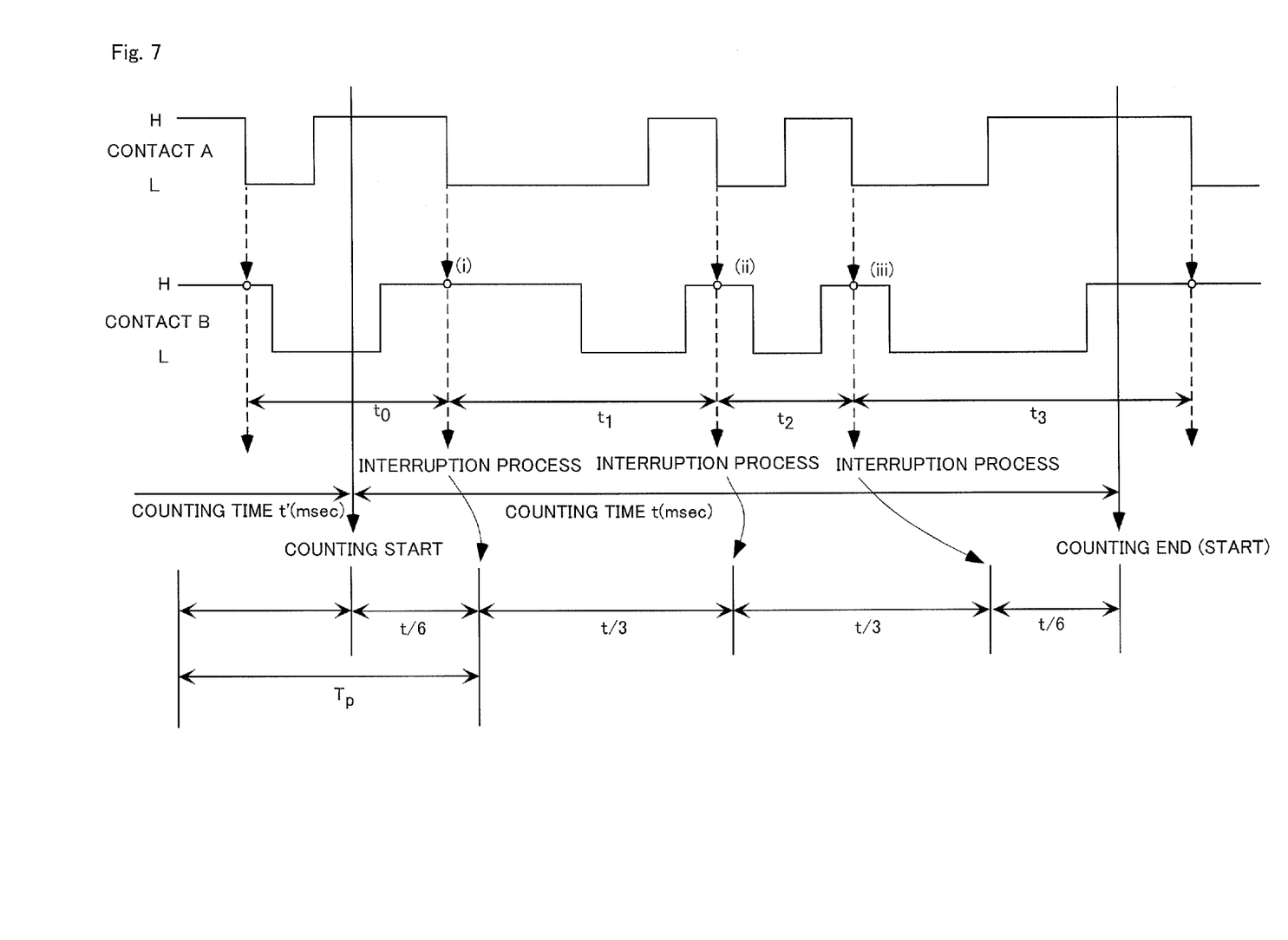
FIG. 7 is a diagram illustrating one modified example of the alternate pulse interval.

In the above embodiment, when one or more pulses are counted within the counting time t, it is assumed that the counted first pulse is generated at the counting start time, so that the volume determining process is performed. The present invention is not limited thereto, and when one or more pulses are counted within the counting time t, the volume determining process may be performed without assuming that the counted first pulse is generated at the counting start time. For example, as shown in FIG. 7, when the number of pulses $C_n=3$ is counted within the counting time t, it is assumed that the first pulse is generated after t/6 from the counting start. It is assumed that the second and subsequent pulses are generated every t/3, and the process is performed. In this case, the pulse interval $T_p$, which is used for the first volume determining process after lapse of the counting time t, is time which is obtained by adding t/6 to time between time at which the last pulse is assumed to be generated at the counting time t' before the counting time t and counting start time.

In the above embodiment, the case of determining the volume using the equation (2) has been described, but constants other than V and $T_p$ (constants a, b, c, and d in the equation (1)) can be suitably changed. Further, the calculation formula for determining the volume may be other than the equations (1) and (2).

In the above embodiment, the counting time t is divided by the number of pulses $C_n$ calculated by the counting section 21, so that the alternate pulse interval is calculated. However, the counting time t may be multiplied by a reciprocal $1/C_n$ of the number of pulses $C_n$ counted by the counting section 21, so as to calculate the alternate pulse interval.

In the above embodiment, the case in which the rotary encoder 4 is used as a pulse output unit has been described. The present invention is not limited thereto, and a slide-type encoder may be used as the pulse outputting unit instead of the rotary encoder 4. In this case, a slide-type operation lever can be used instead of the volume knob 3.

In the above embodiment, the volume adjusting apparatus for adjusting the volume of the audio signal has been described as the quantity adjusting apparatus. The present invention is not limited thereto, and for example, a time adjusting apparatus for adjusting the number of seconds and the number of minutes of time may also be used. In the case of the time adjusting apparatus, the number of seconds and the number of minutes of time may be changed by rotation of a knob (corresponding to the volume knob 3 in the above embodiment).

The present invention can be suitably employed in the volume adjusting apparatus and the time adjusting apparatus which are provided to various apparatuses for generating audio including AV equipment such as a stereo unit, a television set, and a personal computer.

What is claimed is:
1. A quantity adjusting apparatus comprising:
an operating section for instructing a quantity of a subject to be adjusted;
a pulse output section for outputting a pulse according to an operating speed of the operating section;
a storage section for storing a current quantity of the subject to be adjusted;
a counting section for counting a number of the pulses output from the pulse output section within a counting time;
a quantity controller for performing a process for determining a new quantity of the subjects to be adjusted based on a pulse interval that is an interval of an output start time of the two pulses and the current quantity stored in the storage section and storing the determined new quantity as the current quantity in the storage section, the same number of times as the number of the pulses counted by the counting section every counting time and for outputting last information stored as the current quantity in the storage section; and
a quantity changing section for changing the quantity of the subject to be adjusted based on information about the current quantity output from the quantity controller, wherein
the quantity controller uses an alternate pulse interval that is based on the counting time and the number of pulses counted by the counting section within the counting time as the pulse interval.

2. The quantity adjusting apparatus according to claim 1, wherein the quantity controller divides the counting time by the number of pulses counted by the counting section, to calculate the alternate pulse interval.

3. The quantity adjusting apparatus according to claim 1, wherein when a value obtained by dividing the counting time by the number of pulses counted by the counting section is a value after a decimal point, the quantity controller adjusts the divided value to an integer and calculates the alternate pulse interval.

4. The quantity adjusting apparatus according to claim 1, wherein the subject to be adjusted is an audio signal, and the quantity is a volume.

* * * * *